United States Patent [19]

Carlson

[11] Patent Number: 4,555,809
[45] Date of Patent: Nov. 26, 1985

[54] R.F. DIPLEXING AND MULTIPLEXING MEANS

[75] Inventor: David J. Carlson, Indianapolis, Ind.

[73] Assignee: RCA Corporation, Princeton, N.J.

[21] Appl. No.: 545,670

[22] Filed: Oct. 26, 1983

[51] Int. Cl.$^4$ .................. H04B 1/26; H03H 7/42; H03H 7/46
[52] U.S. Cl. .................. 455/190; 333/103; 333/132; 333/25; 455/180
[58] Field of Search ............ 333/101, 104, 119, 126, 333/129, 132, 134, 25, 26; 343/859; 455/188, 180, 190

[56] References Cited

U.S. PATENT DOCUMENTS

| | | | |
|---|---|---|---|
| 2,214,830 | 9/1940 | Carlson et al. | 455/180 |
| 2,454,784 | 11/1948 | Engel | 333/4 |
| 3,428,919 | 2/1969 | Webb | 333/25 X |
| 3,818,385 | 6/1974 | Mouw | 455/326 X |
| 3,938,046 | 2/1976 | Valdettaro . | |
| 4,173,742 | 11/1979 | Lehmann . | |
| 4,408,348 | 10/1983 | Theriault . | |
| 4,462,010 | 7/1984 | Strammello | 333/129 X |
| 4,480,338 | 10/1984 | Dobrovolny | 455/188 |
| 4,499,602 | 2/1985 | Hermeling, Jr. et al. | 455/180 |

Primary Examiner—Paul Gensler
Attorney, Agent, or Firm—E. M. Whitacre; P. J. Rasmussen; P. M. Emanuel

[57] ABSTRACT

Selection elements such as diodes or filters are provided for selectively grounding either one of the two unbalanced terminals of a balun. This allows either a signal, such as the R.F. signals from a VHF or a UHF antenna, applied to the other unbalanced terminal of the balun to be selectively coupled to the balanced terminals of the balun in a diplexer arrangement. In a tuner, the balun may be used as part of a doubly balanced mixer. In another embodiment, the balanced terminals are used as inputs and the unbalanced terminals are used as outputs with the selection elements coupled to the outputs to form an R.F. multiplexer.

26 Claims, 3 Drawing Figures

R.F. DIPLEXING AND MULTIPLEXING MEANS

BACKGROUND OF THE INVENTION

The present invention relates to RF (radio frequency) combining apparatus, and more particularly to a diplexer that can be used in a double conversion TV tuner and also to a multiplexer.

In television tuners that tune both VHF and UHF signals of the type described in U.S. Pat. No. 4,408,348 filed in the name of G. E. Theriault, signals in the respective band are first filtered by respective tunable filters and then applied to respective RF amplifiers. The output signal of the VHF amplifier is passed through an LPF (low pass filter) having a cutoff frequency of just beyond 402 MHz (the upper limit of cable channel W+17). The output signal of the UHF amplifier is passed through an HPF (high pass filter) having a cutoff frequency of just below 470 MHz (the lower limit of channel 14). The output signals of both filters are combined and the combined signal is then applied to the signal terminal of the unbalanced input port of a balun. The signals developed at the balanced output port of the balun are applied to the input of a balanced mixer.

The purpose of the LPF and HPF is to inhibit reception of signals in one band when channels in the other band are selected for reception. However, because the cutoff frequencies of the filters are relatively close and the filters have a gradual cutoff characteristics, and further because each filter may have spurious resonances in the other filter's passband, the filters may undesirably interact, e.g., the LPF may cause attenuation of UHF signals and the HPF may cause attenuation of VHF signals.

Mechanical or electronic switches can be used to select between the filter outputs to prevent interaction. Mechanical switches have limited lifetimes. Electronic switches, such as series connected switching diodes, have inherent capacitance that can resonate with stray inductances, which can cause undesirable attenuation of the selected signals particularly the UHF signals. In addition, to provide the desired degree of decoupling, a series-connected and a shunt-connected switching element often has to be used for each signal to be switched. Thus if two signals have to be switched, four switching elements (e.g., diodes) may be required which is costly.

It is therefore desirable to provide a diplexing apparatus for selectively coupling one or two RF signals to a common output without the problems of the above-described combining apparatus. It is also desirable to provide a multiplexing apparatus for selectively coupling one RF signal to one of two outputs with similar characteristics.

SUMMARY OF THE INVENTION

In accordance with the present invention, a balun having unbalanced and balanced ports and means for selectively grounding a selected one of the terminals of the unbalanced port is used to allow a signal to be developed at the other terminal of the unbalanced port. The invention can be used as a diplexer to selectively couple one of two input signals to an output, or as a multiplexer to selectively couple one input signal to one of two outputs.

DETAILED DESCRIPTION

Figure 1:
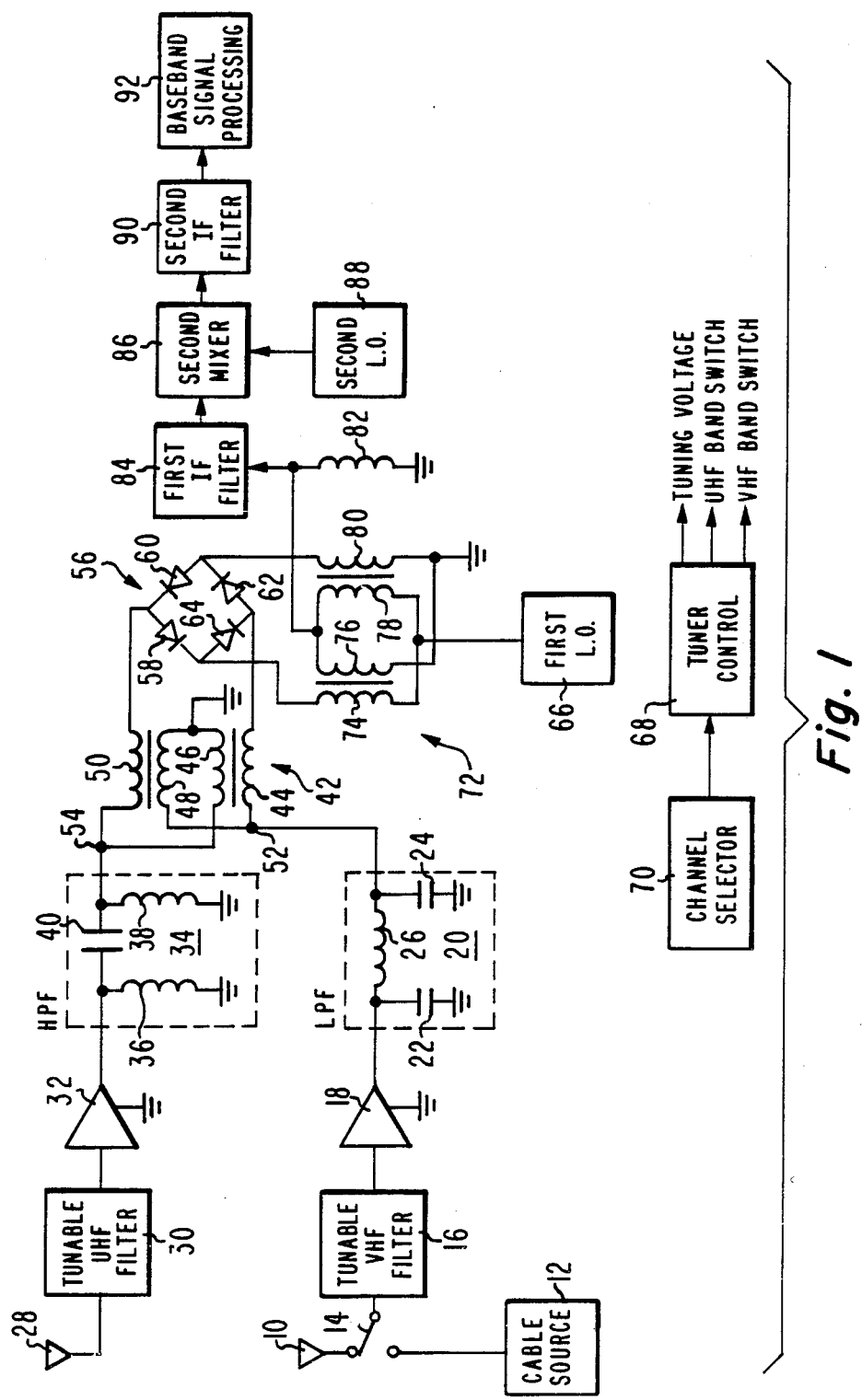
FIG. 1 is a partly block and partly schematic diagram of a television receiver incorporating an embodiment of the invention used as a diplexer.

Referring to FIG. 1, there is shown a VHF antenna 10 and a cable source 12, one of which is selected by means of switch 14 to be the input signal source of tunable VHF filter 16. The output signal from filter 16 is applied to VHF amplifier 18. The output signal from amplifier 18 is unbalanced (referenced to ground) and is applied to LPF 20 comprising shunt capacitors 22 and 24 and series inductor 26. Elements 22, 24, and 26 have values selected so that LPF 20 has a cutoff frequency of just above 402 MHz, the upper frequency limit of cable channel W+17. UHF antenna 28 supplies signals to UHF tunable filter 30, which in turn is coupled to UHF amplifier 32. The output signal from amplifier 32 is also unbalanced (referenced to ground) and is applied to HPF 34 comprising shunt inductors 36 and 38 and series capacitor 40. The values of elements 36, 38 and 40 are selected so that HPF 34 has a cutoff frequency of just below 470 MHz, the lower frequency limit of UHF channel 14.

A balun 42, which is itself of conventional construction, comprises a first pair of bifilar windings 44 and 46 wound around a ferrite core and a second pair of bifilar windings 48 and 50 wound about another ferrite core. The left ends (as viewed in FIG. 1) of windings 44 and 48 are connected together to form a first terminal 52 of the unbalanced port of balun 42, while the left ends of windings 46 and 50 are connected together to form a second terminal 54 of said unbalanced port. The right ends of windings 46 and 48 are connected together and to signal ground, while the right ends of windings 44 and 50 provide balanced signals to the junction of diodes 58 and 60 and the junction of diodes 62 and 64, respectively, of a diode bridge 56. Balun 42 provides a 1:4 impedance transformation between its unbalanced input port and its balanced output port.

In a conventional balun, one of the terminals of the unbalanced port is the signal input and the other is permanently coupled to ground. In the embodiment of the present invention, shown in FIG. 1, balun 42 which cooperates with a diode bridge 56 to form a doubly balanced mixer, also serves as a diplexer for selectively allowing the VHF or UHF signals to be mixed with the local oscillator signal generated by first LO (local oscillator) 66. Specifically, the output of HPF 34 is coupled to terminal 54, while the output of LPF 20 is coupled to terminal 52. For VHF frequencies through at least 402 MHz, coil 38 in conjunction with capacitor 40 and inductor 36 provides a low enough reactance so that terminal 54 is effectively grounded, thereby providing a reference point for developing an input signal at terminal 52. Thus, for VHF signals the input terminal of balun 42 is 52 and the reference terminal is 54. For UHF frequencies, starting at least at 470 MHz, capacitor 24 in conjunction with inductor 26 and capacitor 22 provides a low enough reactance so that terminal 52 is effectively grounded, thereby providing a reference point for developing an input signal at terminal 54. Thus, for UHF signals, the input terminal of balun 42 is 54 and the reference terminal is 52. LPF 20 and HPF 34, therefore, act as switching means for controlling balun 42 to couple either VHF signals or UHF signals to diode bridge 56 of the doubly balanced mixer. In this capacity, the filter of the selected signals serves to pass only the desired signals to the respective terminal of the unbalanced port and the filter of the nonselected signals serves to reference the other terminal of the unbalanced port to signal ground. Thus, automatic switching takes place. In addition, one filter does not affect the signal in the other filter due to the isolation provided by balun 42 which presents low impedances (e.g., 75 ohms) at both of its unbalanced input terminals.

First L.O. 66 has a frequency range of 471 to 1301 MHz so as to provide conversion of the RF signal to a first IF frequency range of 411-417 MHz. (The term "first IF" is conventionally used although the VHF and cable RF signals are up-converted.) The first I.F. signal is applied to first I.F. filter 84 having a passband of 411 to 417 MHz. L.O. 66, as well as tunable filters 16 and 30, is controlled by tuning, UHF bandswitch, and VHF bandswitch voltages developed by tuner control circuit 68, which in turn is under the control of channel selector 70, all as known in the art.

The single ended (unbalanced) output signal from L.O. 66 is applied to balun 72 comprising coils 74, 76, 78 and 80 arranged in conventional fashion. The balanced output signal of balun 72 is derived from the upper ends of coils 74 and 80 and is applied to the junction of diodes 58 and 64 and to the junction of diodes 60 and 62, respectively. First IF signal is derived from the junction of coils 76 and 78. Coil 82, which is a choke in the frequency range of the first IF signal, provides a ground return for diodes 58, 60, 62, and 64. The use of a doubly-balanced mixer helps prevent the R.F. and LO signals from undesirably reaching the first I.F. section where they may produce interference signals, and also helps prevent the LO signal from reaching the input R.F. circuits where they may be radiated from the receiver in violation of FCC standards.

Second mixer 86 receives the output signal from filter 84 and a 370 MHz signal from second L.O. 88. The output signal from second mixer 86 is applied to second I.F. filter 90 having a passband in the range of 41-46 MHz conventionally employed in the United States. The output signal from filter 90 is applied to baseband processor 92, which demodulates its picture, sound and color carriers, and thereafter processes the respective baseband response to produce the visual and audio responses for the selected channel.

Some cable systems have capacity up to channel W+34, which has an upper frequency limit of 502 MHz. Since this frequency is in the UHF range, the filters 20 and 34 cannot discriminate between desired and undesired signals. Therefore, the embodiment of FIG. 1 cannot be used. An embodiment which overcomes this problem is shown in FIG. 2.

Figure 2:
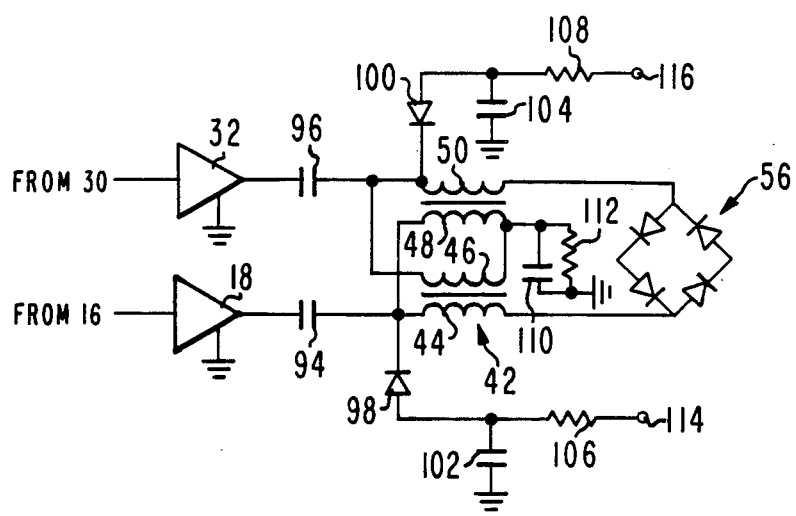
FIG. 2 is a schematic diagram of an alternate embodiment of the invention used as a diplexer.

In FIG. 2 only those portions of FIG. 1 are repeated as are necessary to understand the interconnection of the second embodiment with the remaining tuning system, and corresponding reference numbers are used to identify corresponding elements. In this embodiment, LPF 20 and HPF 34 of the embodiment of FIG. 1 are not present. The VHF output signal from R.F. amplifier 18 is applied through DC blocking capacitor 94 to the junction of windings 44 and 48 of balun 42, which forms one terminal of the unbalanced port, and the UHF output signal of R.F. amplifier 32 is applied through DC blocking capacitor 96 to the junction of windings 46 and 50 of balun 42 which forms the other terminal of the unbalanced port. As in FIG. 1, the right ends of windings 44 and 50 are the terminals of the balanced port and supply the R.F. signal to diode bridge 56 of the doubly balanced mixer, which mixer also receives the first L.O. signal exactly as in FIG. 1, i.e., via a balun (not shown in FIG. 2) that also provides the I.F. signal to the remainder of the circuitry (not shown in FIG. 2). A diode switching element 98 has its cathode connected to the junction of the left end of windings 44 and 48, and diode switching element 100 has its cathode connected to the left end of windings 46 and 50. R.F. bypass capacitors 102 and 104 couple the anodes of diodes 98 and 100, respectively to ground. Current limiting resistor 106 is connected to the anode of diode 98, while current limiting resistor 108 is connected to the anode of diode 100. The right ends of windings 46 and 48 are not connected directly to ground as in FIG. 1, but rather through the parallel combination of R.F. bypass capacitor 110 and resistor 112. Terminal 114 receives a positive UHF bandswitch voltage (of approximately +5 volts) to forward bias diode 98 when it is desired to receive UHF signals, while terminal 116 receives a positive VHF bandswitch voltage (of approximately +5 volts) to forward bias diode 100 when it is desired to receive VHF signals.

To understand the operation of the embodiment of FIG. 2, assume it is desired to receive VHF signals. In that case, a low voltage (e.g., 0 volts) is applied to terminal 114, while the positive bandswitch voltage is applied to terminal 116. The latter voltage is of sufficient magnitude to forward bias diode 100. Thus, the left ends of windings 46 and 50 are bypassed to ground by capacitor 104. Therefore the UHF signals are shunted to ground, and hence not applied to balun 42 the same time a signal ground reference is established at the UHF input terminal of balun 42 for the VHF input signals applied to the junction of windings 44 and 48. Since diode 98 is back biased by the voltage developed across resistor 112 by the forward bias current of diode 100, capacitor 102 does not bypass the VHF input of balun 42 to ground, and therefore the VHF signals applied to the left ends of windings 44 and 48 of balun 42 are developed between the terminals of the unbalanced port and as a result coupled through the balun to the terminals of the balanced port.

The operation for selecting UHF signals is similar. Briefly, when UHF signals are to be received, terminal 116 receives a low voltage, while terminal 114 receives the positive UHF bandswitch voltage from tuner control 68 of FIG. 1. This forward biases diode 98 and back biases diode 100. The VHF signals and the left ends of windings 44 and 48 are now bypassed to ground by capacitor 102, the latter establishing a signal ground reference for the UHF input signals. The UHF signals applied to balun 42 are therefore applied to diode bridge 56.

Since diodes 98 and 100 are in shunt with the signal at a low impedance point due to the low output impedances of amplifiers 18 and 32 and the low input impedance of balun 42 (approximately 75 ohms), the diode capacitance when the diodes are nonconducting (not shunting signal to ground) causes relatively little attenuation of the selected signal. In addition, it is noted that there are only two diodes used to switch two signals in comparison with four diodes (i.e., two for each signal)

that would be typically required to provide a comparable degree of decoupling if series-shunt switching arrangements were used to switch two signals.

With respect to the embodiment of FIG. 2, it should be noted that since it is desired to tune cable channels 5 thru W+34 which extends to 502 MHz, there is no gap between the VHF and UHF ranges in which the frequency range of the first IF signal can be located. Accordingly, the 411–417 MHz IF cannot be used. However, a range of 608 to 614 MHz (channel 37) is normally unused for television broadcast for reasons explained in U.S. patent application Ser. No. 508,595, filed June 28, 1983, now issued as U.S. Pat. No. 4,499,602, under common assignment herewith. This range can therefore be used in the embodiment of FIG. 2 for the frequency range of the first IF signal. In this case, first L.O. 66 should provide signals having a frequency range of 668 to 1498 MHz, while second L.O. 88 should provide a 567 MHz signal so that the conventional 41–46 MHz second IF range can be used.

If desired, the embodiments of FIGS. 1 and 2 can be combined when there is no overlap of frequency ranges so that a HPF and an LPF are followed by diode switching elements to obtain greater isolation than would be obtained from either embodiment when used alone.

Figure 3:
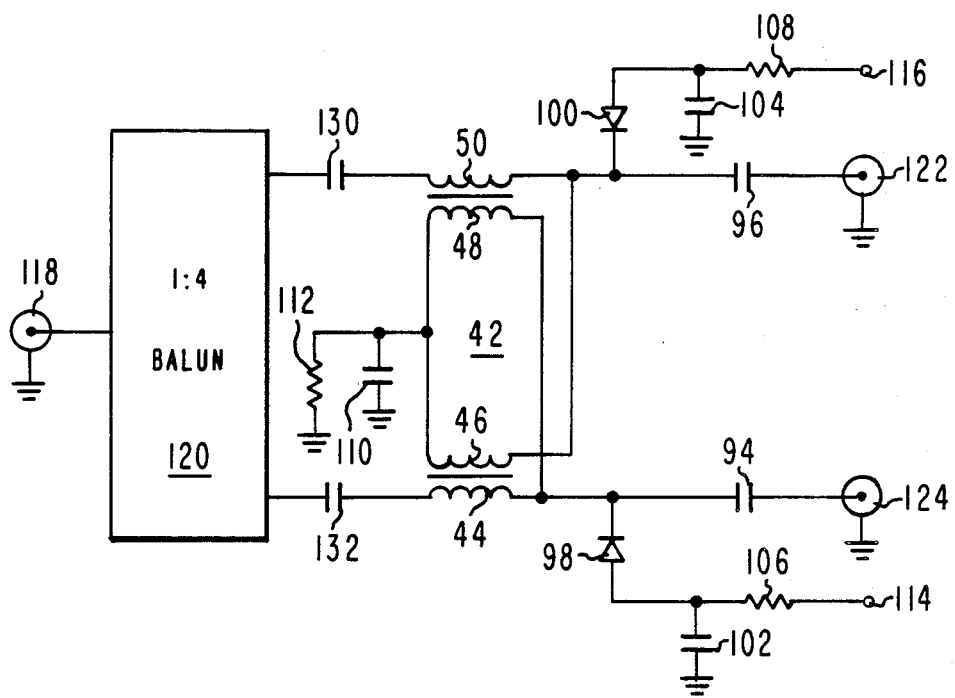
FIG. 3 is a schematic diagram of an embodiment of the invention used as a multiplexer.

FIG. 3 shows a third embodiment of the invention used as a multiplexing means, for example, to connect an antenna to either a TV receiver or a VTR (video tape recorder). Briefly, it is like the embodiment of FIG. 2 except that the input and output ports are interchanged. Corresponding elements in the two FIGURES have been given corresponding reference numerals for purposes of comparison.

In FIG. 3, an unbalanced signal, such as is provided by a conventional 75 ohm VHF receiving antenna, is provided at a 75 ohm input coaxial connector 118 and supplied to conventional 1:4 impedance transforming balun 120 serving as a source of balanced output signals. The resulting 300 ohm balanced output signals are applied to 4:1 balun 42 through DC blocking capacitors 130 and 132. The 75 ohm unbalanced output signal from balun 42 is available at either output connector 122 or 124, which can be respectively connected to e.g., a TV receiver and a VTR. The switching operation is similar to that described above in conjunction with FIG. 2. Briefly, resistor 112 developes a back bias voltage when switching voltages are selectively applied to either terminal 116 or 114, thereby forward biasing switching diode 100 or switching diode 98, respectively. When diode 98 is conductive, terminal 124 is referenced to signal ground allowing the output signal to be developed at terminal 122. When diode 100 is conductive, terminal 122 is referenced to signal ground allowing the output signal to be developed at terminal 124.

It will be appreciated that many other modifications to the invention, such as alternate switching diode biasing arrangements and using filters as shown in FIG. 1 in the embodiment of FIG. 3 instead of diodes are possible and are intended to be within the spirit and scope of the invention as set forth in the claims.

What is claimed is:

1. Apparatus comprising:
   a balun having an unbalanced port with first and second terminals, said first and second terminals having a winding therebetween, a balanced port with third and fourth terminals, said third and fourth terminals having a winding therebetween, and an impedance transformation circuit coupled between the unbalanced and balanced ports for coupling signals therebetween;
   a point of reference potential;
   first unbalanced circuit means referenced to said reference potential coupled to said first terminal of said unbalanced port;
   second unbalanced circuit means referenced to said reference potential coupled to said second terminal of said unbalanced port;
   balanced circuit means coupled between said third and fourth terminals of said balanced port;
   first selection means for selectively coupling said first terminal of said unbalanced port to said point of reference potentential, thereby allowing signals to be coupled between said second terminal and said third and fourth terminals; and
   second selection means for selectively coupling said second terminal of said unbalanced port to said point of reference potential, thereby allowing signals to be coupled between said first terminal and said third and fourth terminals.

2. Apparatus as claimed in claim 1, wherein said unbalanced port is an input port, said first and second circuit means are respective first and second signal sources, and said balanced port comprises an output port.

3. Apparatus as claimed in claim 1, wherein said unbalanced port is an output port, said balanced port is an input port, and said balanced circuit means is a signal source.

4. Apparatus as claimed in claim 1, wherein said first and second selection means includes respective first and second filters.

5. Apparatus as claimed in claim 1, wherein said first and second selection means include respective switching elements.

6. Apparatus comprising:
   a point of reference potential;
   a balun having first and second bifilar windings and third and fourth bifilar windings, each of said windings having first and second ends;
   said first ends of said first and third windings being coupled together to form a first terminal and said first ends of said second and fourth windings being coupled together to form a second terminal, said first and second terminals comprising an unbalanced port;
   said second ends of said second and third windings being coupled together and to said point of reference potential for radio frequency signals;
   said second ends of said first and fourth windings respectively comprising third and fourth terminals of a balanced port;
   first selection means for selectively coupling said first terminal of said unbalanced port to said point of reference potential, thereby allowing signals to be coupled between said second terminal and said third and fourth terminals; and
   second selection means for selectively coupling said second terminal of said unbalanced port to said point of reference potential thereby allowing signals to be coupled between said first terminal and said third and fourth terminals.

7. Apparatus as claimed in claim 6, wherein said selection means each comprise a pair of filter means for coupling signals in different respective frequency ranges to said first and second terminals and said point of reference potential.

8. Apparatus as claimed in claim 7, wherein said filters respectively comprise a high pass filter and a low pass filter.

9. Apparatus as claimed in claim 6, wherein said selection means comprise respective first and second electronic switching means.

10. Apparatus as claimed in claim 9, wherein said electronic switching means comprise diodes.

11. Apparatus comprising:
a balun having unbalanced and balanced ports, said unbalanced port including first and second terminals having a winding therebetween; and
means for selectively grounding either of said terminals, thereby allowing signals to be coupled between the other of said terminals and said balanced port.

12. Apparatus as claimed in claim 11, wherein said selective grounding means comprises first and second filter means coupled to said first and second terminals, respectively for providing a low impedance path between their respective terminals and a point of reference potential for signals in different frequency ranges.

13. Apparatus as claimed in claim 12, wherein said frequency ranges are non-overlapping.

14. Apparatus as claimed in claim 12, wherein said filters respectively comprise a high pass filter and a low pass filter.

15. Apparatus as claimed in claim 14, wherein said high pass filter comprises a coil coupled between one of said terminals and a point of ground potential, and said low pass filter comprises a capacitor coupled between said other terminal and a point of ground potential.

16. Apparatus as claimed in claim 11, wherein said selective grounding means comprises electronic switching elements coupled between said terminals, respectively, and a point of ground potential.

17. Apparatus as claimed in claim 16, wherein said electronic switching elements comprise a pair of diodes respectively coupled to said terminals, means for coupling said diodes to said point of ground potential for radio frequency signals, and means for selectively forward biasing either one of said diodes.

18. Apparatus as claimed in claim 11, further comprising a pair of signal sources respectively coupled to said terminals and a load coupled to said balanced port.

19. Apparatus as claimed in claim 11, further comprising a pair of loads respectively coupled to said terminals and a signal source coupled to said balanced port.

20. Apparatus comprising:
VHF and UHF signal sources;
a first balun having unbalanced and balanced ports, said unbalanced port having a pair of terminals respectively coupled to said sources;
means for selectively grounding a selected one of said terminals;
a mixer coupled to said balanced port;
a second balun having an unbalanced port and a balanced port coupled to said mixer; and
a local oscillator coupled to said second balun unbalanced port.

21. Apparatus as claimed in claim 20, wherein said selective grounding means comprises low pass and high pass filters respectively coupled between said terminals and said VHF and UHF sources.

22. Apparatus as claimed in claim 21, wherein said high pass filter comprises a shunt coil coupled to said one of said terminals coupled to said UHF source, and said low pass filter comprises a shunt capacitor coupled to said one of said terminals coupled to said VHF source.

23. Apparatus as claimed in claim 20, wherein said selective grounding means comprises a pair of electronic switching elements respectively coupled to said terminals.

24. Apparatus as claimed in claim 23, wherein said electronic switching elements comprise a pair of diodes respectively coupled to said terminals, means for coupling said diodes to ground for radio frequency signals, and means for selectively forward biasing either one of said diodes.

25. Apparatus comprising: a balanced signal source; a balun having a balanced port coupled to said source and an unbalanced port having a pair of terminals adapted to be respectively coupled to a pair of loads; a pair of switching means respectively coupled to said terminals for grounding either one of said terminals whereby said source is selectively coupled to the other one of said loads.

26. Apparatus comprising: a pair of unbalanced signal sources; a balun having a balanced port adapted to be coupled to a load and an unbalanced port having a pair of terminals, said terminals having a winding therebetween; a pair of switching means respectively coupled to said signal sources and said terminals for selectively grounding either one of said terminals for selectively coupling the other terminal to said load.

* * * * *